United States Patent [19]

Oritsuki et al.

[11] 4,426,548
[45] Jan. 17, 1984

[54] MULTILAYER WIRING STRUCTURE

[75] Inventors: Ryoji Oritsuki; Tohru Watanabe; Kazuo Shirahashi, all of Mobara; Hiromi Kanai; Kozo Odawara, both of Chiba, all of Japan

[73] Assignee: Hitachi, Ltd., Tokyo, Japan

[21] Appl. No.: 346,921

[22] Filed: Feb. 8, 1982

[30] Foreign Application Priority Data

Feb. 13, 1981 [JP] Japan ................................. 56-19107

[51] Int. Cl.[3] .................. H05K 1/14; H05K 1/16; H01R 4/02
[52] U.S. Cl. ........................ 174/72 R; 174/117 PC; 361/410; 361/416
[58] Field of Search .......... 174/117 E, 117 PC, 72 R, 174/72 TR; 361/410, 416

[56] References Cited

U.S. PATENT DOCUMENTS

| 782,391 | 2/1905 | Hanson | 174/72 TR |
| 2,558,008 | 6/1951 | Smith | 174/72 TR |
| 3,499,098 | 3/1970 | McGahey | 361/416 X |
| 3,725,744 | 4/1973 | Reed | 361/416 X |
| 3,824,433 | 7/1974 | Newton | 361/416 |

FOREIGN PATENT DOCUMENTS

| 2751096 | 5/1979 | Fed. Rep. of Germany | 174/68.5 |
| 2903000 | 8/1980 | Fed. Rep. of Germany | 361/416 |
| 52-21693 | 2/1977 | Japan | 174/68.5 |

OTHER PUBLICATIONS

Breuninger; K. et al.; Printed Circuit Crossovers by a Thin-Film-Thick-Film Technique; Feinwerk Technik & Mess Technik; vol. 84, No. 7, pp. 321-322; Oct.-Nov. 1976.

Primary Examiner—A. T. Grimley
Assistant Examiner—Morris H. Nimmo
Attorney, Agent, or Firm—Charles E. Pfund

[57] ABSTRACT

A multilayer wiring structure comprising a plurality of groups of patterns each having a multiplicity of wirings formed on the opposite sides of an intervening insulation film. The intervening insulation film is formed with a void exposed to both an upper pattern of a multiplicity of wirings and a lower pattern of a multiplicity of wirings, the upper and lower patterns being formed on and beneath the intervening insulation film and arranged to form a matrix. The void extends longitudinally across one of the patterns, and the upper and lower patterns are connected together through the void at crossing points of the matrix.

5 Claims, 7 Drawing Figures

MULTILAYER WIRING STRUCTURE

BACKGROUND OF THE INVENTION

The present invention relates to a multilayer wiring structure, and more particularly to a through-hole connection structure between an upper pattern of a multiplicity wirings and a lower pattern of a multiplicity of wirings which are formed on and beneath an intervening insulation film.

As a device using such a multilayer wiring structure, there has been proposed, for instance, an intimate contact type optical sensor array as shown in FIG. 1. In the figure, reference numeral 1 denotes an original to be transmitted, 2 a light source comprising, for instance, a light emitting diode, and 3 a contact fiber substrate which is arranged to oppose the transmission original 1 and which is provided with a plurality of optical fibers 4 embedded in the surface into which the incident light from the light source 2 enters after being reflected on the transmission original 1. Reference numeral 5 denotes a glass substrate arranged to oppose the contact fiber substrate 3 and carrying a photo-detector (to be described later) on the part opposing the output terminal of the optical fibers 4, and 6 conductor electrodes of Cr-Al alloy deposited on the glass substrate 5 and also acting as wiring leads. Reference numeral 7 denotes a conductive film of n-type semiconductor such as CdSe formed on the conductive electrode 6, 8 a photoelectric conversion film of p-type semiconductor such as Se-As-Te family material formed on the n-type semiconductor 7, and 9 transparent common electrodes of, for instance, $In_2O_3$.

In the optical sensor array device of such a structure as mentioned above, the light, L, from the light source 2 is reflected on the reading surface of the transmission original 1, converted to a light signal L' to be guided through the bundle of optical fibers 4 embedded within the fiber substrate 3 to the photoelectric conversion film 8, and then converted again into an electric signal from the light signal L'. After the conversion, the electric signal activates scanning circuits 10 and 11 for matrix driving as shown in FIG. 2.

In the intimate contact optical sensor array device constructed as above, since the intimate contact line sensor does not need to enlarge or reduce the picture image of the transmission original 1 by means of the lens system, the resolution becomes proportionate to the widths of the conductive film 7 and the conductive electrode 6 on the photoelectric conversion film 8 or in other words to the density of the microarray. That is, as illustrated in FIG. 3, the resolution is determined by an allowable number of the conductive films 7 and the conductive electrodes 6 to be formed on the photoelectric conversion film 8 which converts the light signal L' into an electric signal. In other words, it is determined by the array pitch, P, for the conductive film 7 and the conductive electrode 6. For example, in order to obtain a resolution of 8 per 1 mm, it is required that $P = 1 - 8 = 125$ μm. Typically, the conductive electrodes 6 are prepared by photoetching process, and amount to 1,800 in number for reading an A4 size original. Furthermore, although the longitudinal length of the glass substrate 5 is about 240 mm, the space reserved for wiring on the glass substrate is quite limited because a driving circuit, an external output connection terminal etc. (not shown) are formed on the periphery of the glass substrate. It is, therefore, extremely difficult to form about 1,800 conductive electrodes, straight or bent, on the glass substrate 5.

In order to realize a matrix array with about 1,800 conductive electrodes 6 in the optical sensor array device of the above mentioned type, a multilayer wiring structure becomes necessary. For instance, if 1,728-bit picture elements are arrayed in a matrix of $32 \times 54$, 1,728 through-holes and $1,727 \times 32 = 55,264$ or $1,727 \times 54 = 93,312$ crossovers will be formed. Thus, it is necessary to form 1,728 fine through-holes by photo resist process, and to make insulation between the through-hole contacts and the crossovers, thus degrading yield rate and reliability.

SUMMARY OF THE INVENTION

An object of this invention is to provide a highly reliable multilayer wiring structure capable of being produced at high yield rate.

According to the invention, an intervening insulation film is formed with a void exposed to both an upper pattern of a multiplicity of wirings and a lower pattern of a multiplicity of wirings which are respectively formed on and beneath the intervening insulation film, the upper and lower patterns being arranged to form a matrix, the void extends longitudinally across one of the patterns, and the upper and lower patterns are connected together through the void at crossing points of the matrix.

DESCRIPTION OF PREFERRED EMBODIMENT

Figure 1:
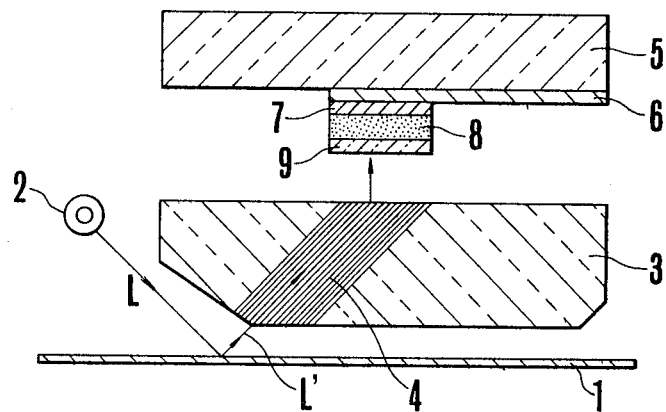
FIGS. 1 through 3 illustrate an optical sensor array device.
Figure 2:
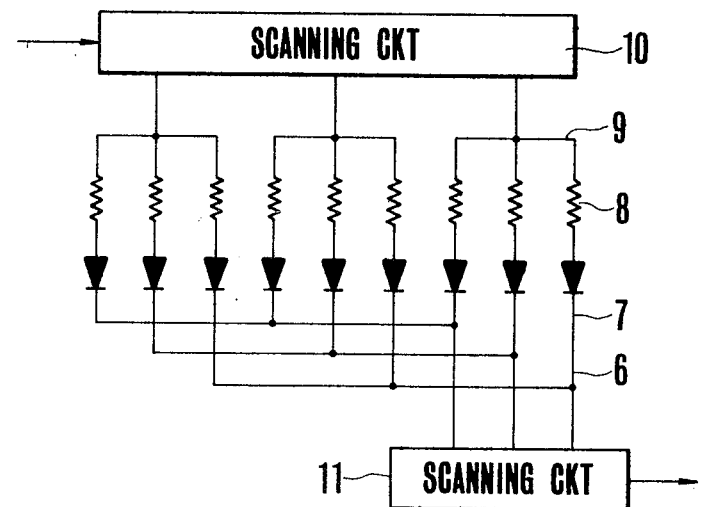
Figure 3:
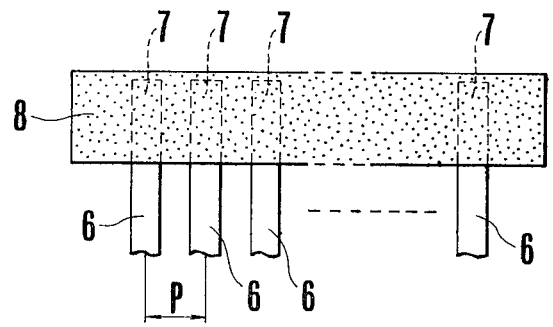
Figure 4A:
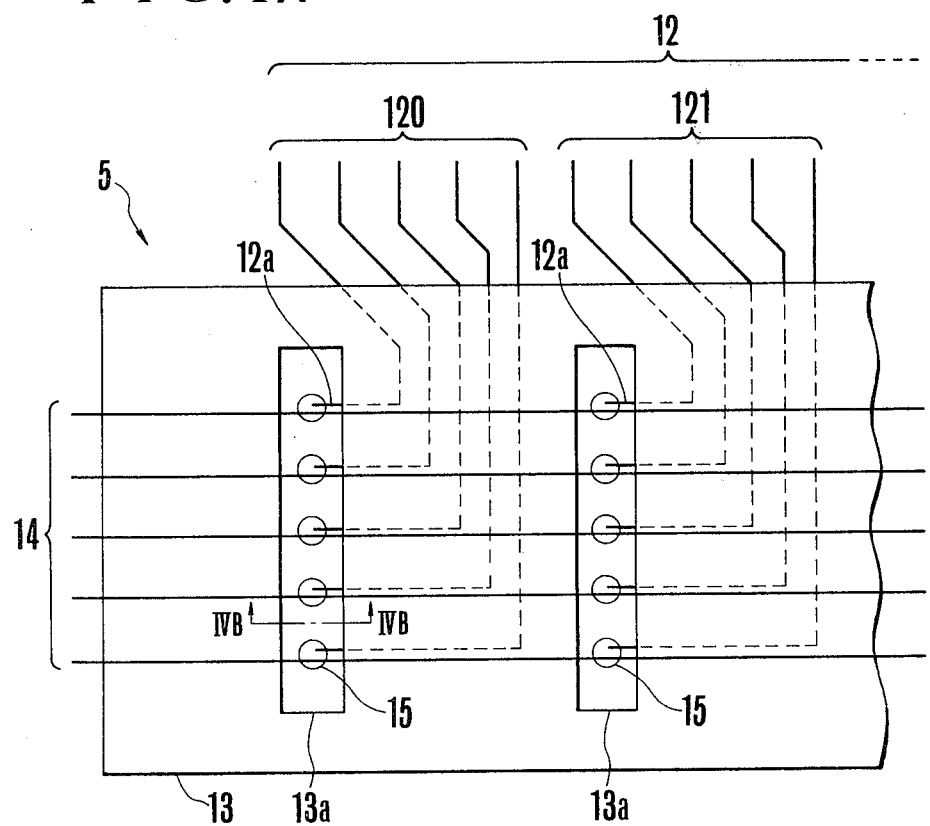
FIG. 4A is an enlarged fragmentary plan view showing a multilayer wiring structure embodying the invention.
Figure 4B:
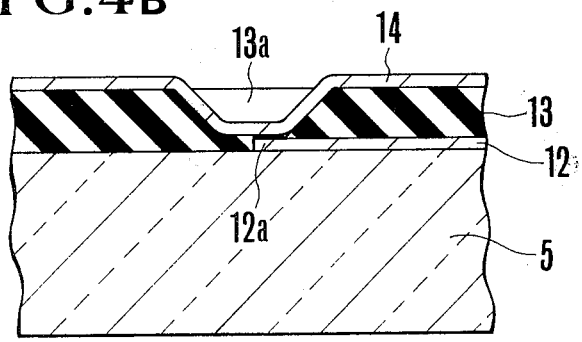
FIG. 4B is a fragmentary sectional view on line IVB—IVB in FIG. 4A.
Figure 5:
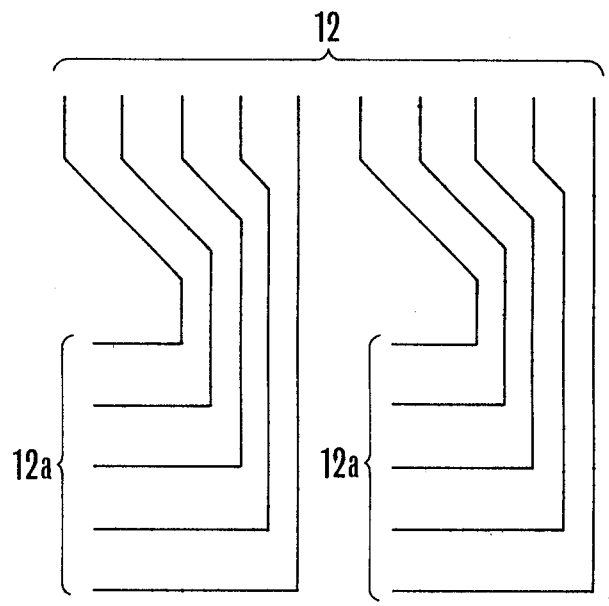
FIG. 5 is an enlarged fragmentary plan view to show an example of a lower wiring pattern in FIG. 4A embodiment.

Referring now to FIGS. 4A and 4B, a pattern 12 of a multiplicity of wirings is deposited on the upper surface of a glass substrate 5. The wiring pattern 12 is divided into a plurality of groups 120, 121, ... (in FIG. 4A, only two groups are illustrated) and correspond to part of the conductor electrodes 6 in FIG. 1. Adjacent wirings of the pattern 12 are spaced at a pitch of about 125 μm. The glass substrate deposited with the pattern 12 is further deposited an insulation film 13 of macromolecule resin in the thickness of 5 to 100 μm. A void 13a of a rectangular form is formed in the film 13, sweeping parallel terminals 12a of the pattern 12 and being exposed to these terminals. On the upper surface of the macromolecule resin film 13 is deposited a pattern 14 of a multiplicity of wirings which corresponds to the remainder of the conductive electrodes 6. The pattern 14 extends along the bent parallel terminals 12a of the pattern 12. As will be seen from FIGS. 4A and 4B, the patterns 12 and 14 are respectively lower and upper patterns with respect to the intervening insulation film 13, and they are arranged to form a matrix. The void 13a is also exposed to the pattern 14 and extends longitudinally across the pattern 14 to intersect the wirings of the pattern 14 at right angles. As shown in FIG. 4B, the void 13a is tapered downwardly, and the wiring of the upper pattern 14 extends along inclined side walls of the void so that the lower pattern terminals 12a exposed to the void 13a and the upper pattern 14 are connected together through the void 13a common to a number of wirings of the patterns to establish crossing points of the matrix.

In such a structure as above, a number of wirings of the lower and upper patterns 12 and 14 are connected together through the single (for one block) void 13a. For instance, in a wiring pattern wherein the number of the wirings of the upper pattern 14 is 32 and the pitch between adjacent wirings is 125 μm, the size of the void 13a can be extended to the order of mm, for example, 5×1 mm, so that high accuracies of fabrication required in a prior art where fine through-holes of about 40 to 50 μm are formed in the intervening insulation film at respective crossing points of the matrix can considerably be mitigated and hence the yield rate can be improved drastically. Further, if the pitch between adjacent terminals 12a of the lower pattern 12 is minimized as possible, the void 13a will have a large opening area sufficient for making easy and steady the connection through the void. Moreover, when the fine through-hole of about 40 to 50 μm is formed in a relatively thick macro-molecule resin insulation film 13, its peripheral edge tends to be rounded and adjacent fine through-holes are inclined to be bridged. However, in the structure of the present invention, the insulation film 13 can be thick sufficiently to assure reliable insulation because the void 13a is completely freed from the problem of creation of the bridging and besides the rounding effect at the peripheral edge is negligible as compared with the size of the void.

Figure 6:
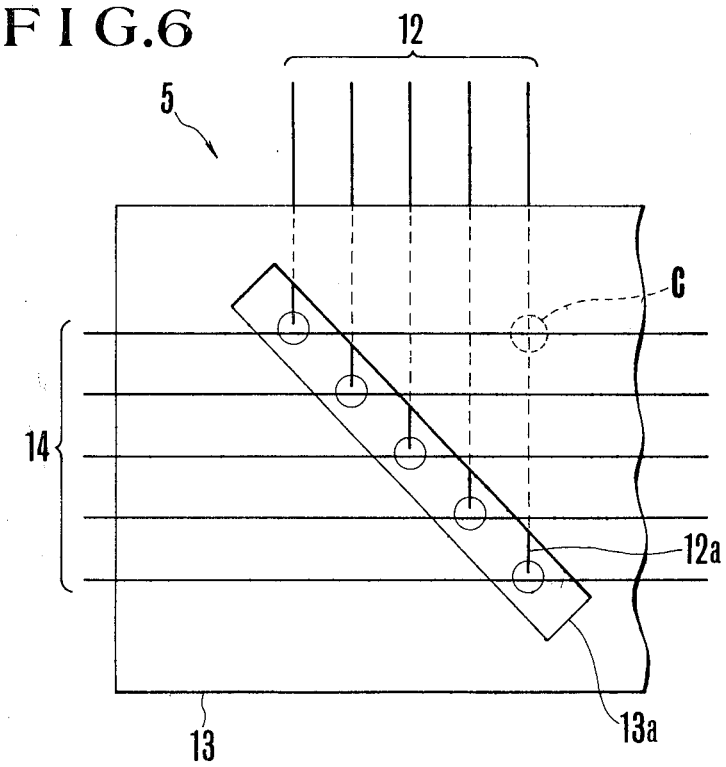
FIG. 6 is an enlarged fragmentary plan view of another embodiment of the multilayer wiring structure according to the present invention.

FIG. 6 shows another embodiment of the multilayer wiring structure according to the present invention wherein the same reference numerals denote same parts as in the previous embodiment. This embodiment is the same as the embodiment illustrated in FIG. 4A with the only exception that the void 13a extending longitudinally across the pattern 14 is inclined with respect to the wirings of the pattern 14 to include the crossing points of the matrix.

This structure can achieve a similar effect to the previous embodiment. Since the macro-molecule resin film 13 can be formed in a sufficient thickness, the insulation at the crossovers (one crossover is shown by C in the figure) can be improved. In addition, in the FIG. 6 embodiment, the lower pattern 12 can be more simplified than in the FIG. 4A embodiment since the bent terminals 12a are dispensed with.

In the foregoing embodiments, the macro-molecule resin film is used as the intervening insulation film between the upper and the lower patterns, but this is not limitative and it is obvious that the same effect can be attained even if a different insulation film such as an $SiO_2$ film is used.

Although the foregoing embodiments have been described by way of the two-layer wiring, the present invention is not limited to this and it may obviously be applied to multilayer structures of more than two layers, such as 3-layer, 4-layer, 5-layer ... n-layer to attain the same effect as described.

As has been described in the foregoing, the multilayer wiring structure according to the present invention mitigates accuracies of fabrication and hence minimizes the defective through-hole connections and insulation film which would otherwise be caused by careless handling in fabrication of fine through-holes. The present invention is extremely advantageous in that it achieves improved yield and reliability.

What is claimed is:

1. In a multilayer wiring structure comprising an upper pattern and a lower pattern formed on opposite sides of an intervening insulation film each of said patterns having a multiplicity of wirings, the improvement wherein the intervening insulation film is formed with a void exposed to both said upper pattern of a multiplicity of wirings and said lower pattern of a multiplicity of wirings, said upper and lower patterns being arranged to form a matrix, the void extends longitudinally across one of said patterns at right angles with respect to the wirings of said pattern, and said upper and lower patterns are connected together through the void at crossing points of the matrix.

2. A multilayer wiring structure according to claim wherein wirings of the lower pattern have terminals parallel to wirings of the upper pattern.

3. A multilayer wiring structure according to claim 1 or 2 wherein the wirings of said lower pattern are deposited on an insulating substrate and said intervening insulation film is deposited on the substrate and the lower pattern.

4. A multilayer wiring structure according to claim wherein said intervening insulation film is an organic film.

5. A multilayer wiring structure according to claim 1, wherein said void has a rectangular configuration.

* * * * *

UNITED STATES PATENT AND TRADEMARK OFFICE
CERTIFICATE OF CORRECTION

PATENT NO. : 4,426,548

DATED : January 17, 1984

INVENTOR(S) : Ryoji Oritsuki et al

It is certified that error appears in the above-identified patent and that said Letters Patent is hereby corrected as shown below:

Col. 4, line 22, change "improved yield" to --improved yield rate--

Col. 4, line 38, Cl. 2, change "according to claim wherein" to --according to claim 1 wherein--

Col. 4, line 46, Cl. 4, change "according to claim wherein" to --according to claim 1 wherein--

Signed and Sealed this

Twenty-ninth Day of January 1985

[SEAL]

Attest:

DONALD J. QUIGG

Attesting Officer     Acting Commissioner of Patents and Trademarks